United States Patent
Sadana et al.

(10) Patent No.: US 7,115,463 B2
(45) Date of Patent: Oct. 3, 2006

(54) PATTERNING SOI WITH SILICON MASK TO CREATE BOX AT DIFFERENT DEPTHS

(75) Inventors: Devendra K. Sadana, Pleasantville, NY (US); Dominic J. Schepis, Wappingers Falls, NY (US); Michael D. Steigerwalt, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 10/923,246

(22) Filed: Aug. 20, 2004

(65) Prior Publication Data

US 2006/0040476 A1 Feb. 23, 2006

(51) Int. Cl.
*H01L 21/762* (2006.01)

(52) U.S. Cl. .............. 438/218; 438/219; 438/405; 438/407; 438/524; 438/526; 438/528; 257/E21.564; 257/E21.563

(58) Field of Classification Search ........... 438/218, 438/219, 294, 295, 405, 407, 524, 526, 528, 438/FOR. 222; 257/E21.563, E21.564
See application file for complete search history.

(56) References Cited

U.S. PATENT DOCUMENTS

| | | | |
|---|---|---|---|
| 4,789,642 A * | 12/1988 | Lorenzo et al. ............... 438/31 |
| 4,968,636 A * | 11/1990 | Sugawara .................... 438/423 |
| 4,997,786 A * | 3/1991 | Kubota et al. ............... 438/480 |
| 5,185,292 A * | 2/1993 | VanVonno et al. ............ 438/59 |
| 5,346,841 A * | 9/1994 | Yajima ....................... 438/295 |
| 5,364,800 A * | 11/1994 | Joyner ........................ 438/405 |
| 6,261,876 B1 * | 7/2001 | Crowder et al. ............. 438/149 |
| 6,756,257 B1 * | 6/2004 | Davari et al. ............... 438/151 |
| 6,774,016 B1 * | 8/2004 | Jang .......................... 438/480 |
| 2001/0002329 A1 * | 5/2001 | Ling .......................... 438/459 |
| 2001/0034086 A1 * | 10/2001 | Crowder et al. ............. 438/149 |
| 2004/0082132 A1 * | 4/2004 | Comard ...................... 438/296 |

* cited by examiner

*Primary Examiner*—George Fourson
(74) *Attorney, Agent, or Firm*—Scully, Scott, Murphy & Presser, P.C.; Robert M. Trepp, Esq.

(57) ABSTRACT

The present invention provides a method of fabricating a patterned silicon-on-insulator substrate which includes dual depth SOI regions or both SOI and non-SOI regions within the same substrate. The method of the present invention includes forming a silicon mask having at least one opening on a surface of Si-containing material, recessing the Si-containing material through the at least one opening using an etching process to provide a structure having at least one recess region and a non-recessed region, and forming a first buried insulating region in the non-recessed region and a second buried insulating region in the recessed region. In accordance with the present invention, the first buried insulating region in the non-recessed region is located above the second buried isolation region in the recessed region. A lift-off step can be employed to remove the first buried insulating region and the material that lies above to provide a substrate containing both SOI and non-SOI regions.

20 Claims, 3 Drawing Sheets

PATTERNING SOI WITH SILICON MASK TO CREATE BOX AT DIFFERENT DEPTHS

FIELD OF THE INVENTION

The present invention relates to a patterned semiconductor substrate, and more particularly to a method of fabricating a patterned semiconductor substrate that includes silicon-on-insulator (SOI) regions and non-SOI, i.e., bulk, regions within the same substrate. The method of the present invention can also provide a dual depth SOI substrate.

BACKGROUND OF THE INVENTION

As semiconductor technologies become more complex, there is a demand for providing semiconductor structures that have more functionality associated therewith. For example, in order to provide customers with the optimum designs, it may be required to build high performance complementary metal oxide semiconductor (CMOS) devices as well as to add additional functions such as dynamic random access memory (DRAM) or radio frequency (RF) applications. All of the devices are optimized under different conditions. For example, RF and DRAM applications have traditionally been built on bulk semiconductor substrates, while higher performance CMOS devices are typically built on silicon-on-insulator (SOI) substrates.

In CMOS devices built on SOI for instance, performance characteristics are known to be greatly improved. Specifically, CMOS devices built on SOI can exhibit less junction capacitance and leakage, greater resistance to ionizing radiation, and immunity to latch up.

In order to achieve optimum performance however, it would be desirable to provide a substrate that has SOI like properties in some regions of the substrate, while having non-SOI like, i.e., bulk, properties in other regions of the substrate.

A semiconductor substrate having a bulk region and an SOI region has the advantages of excellent crystallization of the bulk region and excellent element insulation of the SOI region. For example, logic memory circuits are preferably formed in bulk element regions while high performance logic circuits are preferably formed in the SOI region. It is desirable, therefore, for a semiconductor device to have areas of SOI and bulk silicon adjacent on the same semiconductor substrate.

Numerous techniques have been developed to form SOI and bulk regions. One of the most manufacturable techniques is ion implantation which involves the implantation of high energy ions into a solid surface to form a buried layer. Because the implanted dopants are generally not in the proper lattice position and are mostly inactive, a high temperature annealing process is often used to repair crystal damage and electrically activate the dopants. Implantation of oxygen into silicon is generally a preferred process for building SOI substrates. The separation by implanted oxygen (SIMOX) process can be used, for example, in very large scale integration (VLSI) devices.

Unfortunately, masked or patterned ion implantation produces a region of partial implantation, referred to as the transition region, in the semiconductor substrate. The transition region forms between the area that receives the full ion implant dose and the region that was shielded from implantation, known as the mask region. As a result of this partial dose, the transition region is highly defective, containing crystal defects that may propagate to other regions of the semiconductor silicon layer.

U.S. Pat. No. 5,740,099 issued to Tanigawa teaches building areas of SOI and bulk silicon wafers on a substrate and building different types of circuits in each area. Tanigawa discusses the concept of making multiple regions of SOI and bulk, on the same wafer, using a patterned ion implant. This method is known to cause defects at all of the patterned edge regions.

U.S. Pat. No. 5,612,246 issued to Ahn describes a method and structure in which standard SIMOX SOI wafers are patterned and then the silicon and buried oxide are etched down to the bulk silicon substrate. Ahn then builds devices on the bulk silicon substrate. One problem with this method is that the structure is non-planar and, therefore, the levels or heights of the bulk and SOI devices are different on the wafer. Consequently, every film that is deposited and etched will leave a sidewall or rail around the step between the two levels of silicon.

U.S. Pat. No. 5,364,800 and U.S. Pat. No. 5,548,149, both issued to Joyner, teach a technique using masking oxide of various thickness to produce a buried oxide layer of differing depths. At the extreme ends of the ranges of the mask thickness, Joyner can create thick SOI, thin SOI, or bulk silicon regions. Thus, Joyner can create a substrate with both SOI and bulk regions.

U.S. Pat. No. 4,889,829 issued to Kawai describes a method of making bulk and SOI regions on the same substrate. Kawai builds the bulk in the original substrate and then deposits, using chemical vapor deposition or CVD, an oxide on top to form the buried oxide. Silicon (polysilicon) is then deposited on top of the oxide. Because high-quality devices cannot be built on polysilicon, Kawai then recrystallizes the poly with a laser to form a single crystal. SOI devices are then built on this layer. The final structure is non-planar, as is the structure taught by Ahn, with the inherent problems of such a structure. In addition, the process described by Kawai is impractical because control over recrystallization of the poly is poor.

U.S. Pat. No. 5,143,862 issued to Moslehi teaches SOI wafer fabrication by selective epitaxial growth. Moslehi etches wide trenches, deposits a buried oxide by CVD, removes the oxide from the sidewalls of the trench, then uses selective epitaxial growth to grow the silicon over the oxide region. Moslehi then isolates the region by forming sidewalls on the epitaxial mask, continues to grow the silicon to the surface, and, finally, removes the sidewalls and etches a trench filled with dielectric to isolate devices.

U.S. Pat. No. 5,399,507 issued to Sun also describes a method and structure for forming bulk and SOI regions on a single substrate. The method starts with blanket SOI (formed by SIMOX) and then etches away the silicon and buried substrate layer down to the silicon substrate. At this step of the method, the structure is similar to the structure disclosed by Ahn in that the structure has an exposed bulk silicon region at a different level than the top of the SOI region. Sun goes further, however, and places a sidewall on the etched opening then uses selective epitaxial growth on the silicon which is a continuation of the single crystal silicon. The epitaxial growth continues up to the surface of the SOI region so that the region is planar. Sun may also use a planarizing step to ensure that the two regions are on the same plane. Sun fails either to improve the patterned implants or to remove any defect regions which may exist.

U.S. Pat. No. 6,255,145 to Ajmera, et al. provides a process for forming a planar SOI substrate comprising a patterned SOI region and a bulk region, in which the substrate is free of transitional defects. The process disclosed in Ajmera, et al. comprises removing the transitional defects by creating a self-aligned trench adjacent the SOI region between the SOI region and the bulk region.

U.S. Pat. No. 6,724,046 to Oyamatsu discloses yet another method of forming a substrate that has SOI like and bulk like regions. This prior art method includes the steps of forming a first insulation film, a first semiconductor layer, and a second insulation film in sequence in first to third regions of a semiconductor substrate; removing the first insulation film, the first semiconductor layer, and the second insulation film in the first region and the second insulation film in the third region; selectively forming a second semiconductor layer in the first region of the semiconductor substrate and on the first semiconductor layer in the third region; and removing the second insulation film.

In view of the state of the art mentioned above, there is still a need for providing a simple method that can be used for forming a semiconductor substrate that has SOI like regions and bulk like regions. Also, there is a need for providing a method of forming a dual depth SOI substrate.

SUMMARY OF THE INVENTION

For certain applications, a single substrate having both SOI and non-SOI areas are desired. For other applications, it also is desirable to have a substrate that has more than one thickness of Si-containing material over a buried insulating region. The present invention provides a method of forming both substrates using basically the same processing steps.

Applications for patterned SOI substrates have been discussed in the past, but these take advantage of a mask layer to prevent the implanted oxygen used in a SIMOX process from entering the substrate. Therefore, the masked areas never see the implanted species. In the invention described below, a mask (resist or resist/hardmask bilayer) is used, however, the mask takes advantage of the fact that the continuous buried insulating region can be formed in a Si-containing material at different depths, thereby forming either a dual depth SOI structure, or a structure where the implanted Si-containing material can be lifted off the substrate, leading to a planar patterned SOI structure.

The present invention uses a silicon mask (e.g., resist or resist/hardmask bilayer) to achieve either a dual thickness SOI or a patterned SOI/bulk region by a novel use of etched Si-containing islands. The masking of these regions can be done by conventional photolithography and use of a softmask (resist) and optionally a hardmask, such as $SiO_2$, BSG, BPSG or $Si_3N_4$. If a hardmask is used, it could remain in place, but it does not need to remain for the primary embodiment. With the mask in place, the Si-containing material is recessed using an etching step. The recessed Si-containing material is now ready for SOI formation by SIMOX. The SIMOX includes ion implantation and a high temperature anneal. By using either a single crystal Si-containing substrate or a polysilicon layer as a pattern for either the shallow SOI or non-SOI area, one can form one buried insulating region within the recessed region and another buried insulating region at different level in the non-recessed region. The buried insulating region in the non-recessed region can then be etched with a wet etch to lift the patterned Si-containing material off the structure in the case of patterned SOI.

In broad terms, the method of the present invention comprises the steps of:

forming a silicon mask having at least one opening on a surface of Si-containing material;

recessing the Si-containing material through the at least one opening using an etching process to provide a structure having a recess region and a non-recessed region; and forming a first buried insulating region in said non-recessed region and a second buried insulating region in said recessed region, wherein said first buried insulating region in said non-recessed region is located above said second buried isolation region in said recessed region.

As indicated above, the silicon mask employed in the present can comprise a single resist material or a resist/hardmask bilayer can be employed.

In one embodiment, the method of the present invention also comprises removing the first buried insulating region and said Si-containing material thereabove in said non-recessed region utilizing a lift-off etching process. A planarization process may follow the lift-off step.

In yet another embodiment of the present invention, the at least one opening in the recessed region is processed by forming insulating spacers on the vertical sidewalls of the at least one opening and then filling the at least one opening with a semiconductor material. These steps are performed after the buried insulating regions have been formed.

It is noted that in the broad description of the inventive processing steps, the term "Si-containing material" is used to capture both Si-containing substrate materials as well as a polysilicon layer that can be formed on a Si-containing substrate. Also, the present invention contemplates forming a structure having a plurality of non-recessed regions and a plurality of recessed regions on the same substrate.

DETAILED DESCRIPTION OF THE INVENTION

Figure 1A:
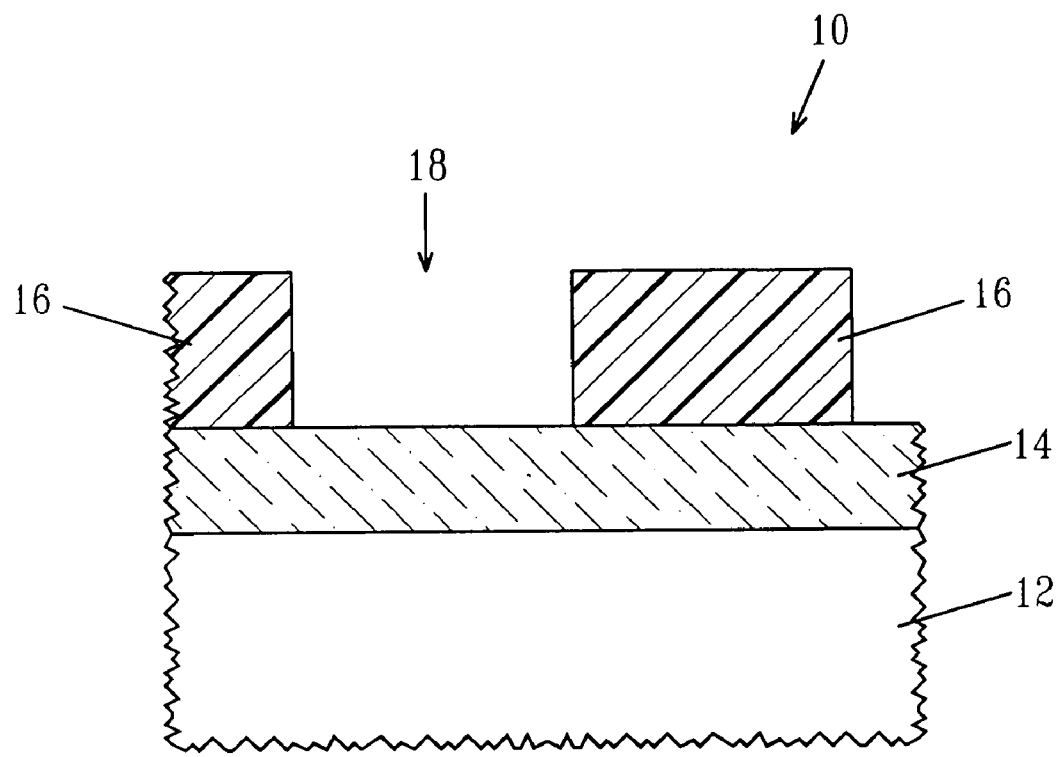
FIGS. 1A–1E are pictorial representations (through cross sectional views) illustrating one embodiment of the present invention for forming a patterned SOI substrate having SOI like regions and non-SOI like regions.

The present invention, which provides a method of fabricating a patterned SOI substrate, will now be described in greater detail by referring to the drawings that accompany the present application. It is noted that the drawings of the present application are provided for illustrative purposes and thus they are not drawn to scale. The patterned SOI substrate formed in the present invention may comprise a substrate containing both SOI and non-SOI regions or a dual depth SOI substrate.

Reference is first made to FIGS. 1A–1E that illustrate one embodiment of the present invention. Specifically, the drawings depicted in FIGS. 1A–1E illustrate the processing flow used in the present invention for fabricating a patterned SOI substrate, i.e., dual depth SOI or a substrate containing SOI and non-SOI regions. The processing flow begins by providing the initial structure 10 shown in FIG. 1A. The initial structure 10 comprises a Si-containing substrate 12, an optional hardmask 14, and a patterned resist 16 that includes at least one opening 18. The resist or resist/hardmask bilayer comprises the silicon mask of the present invention.

As shown, the optional hardmask 14 is formed on a surface of the Si-containing substrate 12, and the patterned resist 16 is located on a surface of the optional hardmask 14 such that the at least one opening 18 exposes a region of the underlying optional hardmask 14. In those embodiments in which the optional hardmask 14 is not present, the patterned resist 16 containing the at least one opening 18 is located directly on a surface of the Si-containing substrate 12.

The term "Si-containing substrate" is used in the present invention to denote any semiconducting material that includes silicon. Illustrative examples of such Si-containing semiconductor materials include, but are not limited to: Si, SiGe, SiGeC, SiC, Si/Si, Si/SiGeC, Si/SiGe, Si/SiGeC, and performed silicon-on-insulators (SOIs) which may include any number of buried oxide (continuous, non-continuous or mixtures of continuous and non-continuous) regions present therein.

The optional hardmask 14 is typically, but not always, formed on a surface of the Si-containing substrate 12 at this point of the present invention. The optional hardmask 14 may comprise an oxide, nitride, oxynitride or combinations, including multilayers thereof. Examples of the optional hardmask 14 material include, for example, $SiO_2$, boron doped silicate glass (BSG), boron phosphorus doped silicate glass (BPSG), $Si_3N_4$ and Si oxynitride. In some embodiments, the optional hardmask 14 may include polySi as well.

When present, the optional hardmask 14 has a thickness that is typically from about 100 to about 800 nm, with a thickness from about 300 to about 400 nm being more typical. The optional hardmask 14 can be formed by a conventional deposition process, such as, for example, chemical vapor deposition (CVD), plasma enhanced chemical vapor deposition (PECVD), chemical solution deposition, atomic layer deposition, evaporation or spin-on coating. Alternatively, the optional hardmask 14 can be formed on the surface of the Si-containing substrate 12 by a thermal oxidation, nitridation or oxynitridation process.

A patterned resist 16 having at least one opening 18 is then formed on the surface of the previously formed hardmask 14, if present, or if the hardmask 14 is not present the resist is formed on the surface of the Si-containing substrate 12. The at least one opening 18 thus exposes either a surface of the optional hardmask 14 or a surface of the Si-containing substrate 12.

The patterned resist 16 having at least one opening 18 is formed by conventional lithography which includes the steps of applying a resist material (either positive tone or negative tone) to either the surface of the Si-containing substrate 12 or the optional hardmask 14, exposing the resist to a desired pattern of radiation and developing the pattern into the resist material by utilizing a conventional resist developer. The thickness of the patterned resist 16 is not critical to the present invention.

In some embodiments not shown, a polySi layer can be formed by a conventional deposition process on the surface of the Si-containing substrate 12 prior to performing the above steps, i.e., prior to forming the optional hardmask 14 and the patterned resist 16 having the at least one opening 18. This embodiment is not shown since the structure would be similar to the one depicted in FIG. 1A except that an upper surface region of the Si-containing substrate 12 would be covered with polySi. In essence, region 12 shown in FIG. 1A can include a lower portion that contains the Si-containing substrate and an upper portion that contains the polySi layer. The polySi layer that is formed in this embodiment typically has a thickness from about 200 to about 600 nm, with a thickness from about 300 to about 400 nm being more typical.

Figure 1B:
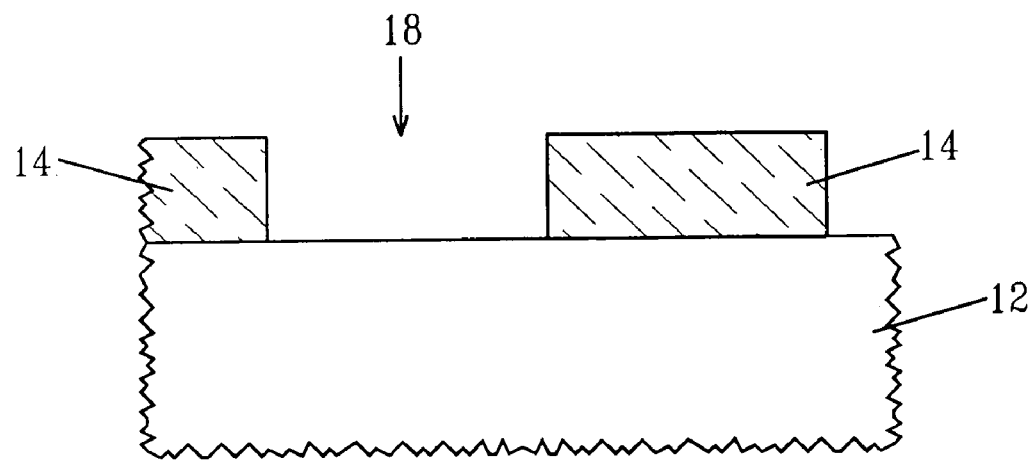

FIG. 1B shows the structure of FIG. 1A after transferring the pattern from the patterned resist 16 to the optional hardmask 14 and removing the patterned resist 16. The pattern transfer to the optional hardmask 14 is performed through the at least one opening 18 utilizing an etching process that selectively removes the exposed portion of the optional hardmask 14, stopping on the surface of the Si-containing substrate 12 or, if present, a surface of the polySi layer. Specifically, the etching process used in the pattern transfer process preferably comprises a dry etching process such as, for example, reactive ion etching (RIE), ion beam etching, plasma etching or laser ablation. Although dry etching is preferably employed, the present invention also contemplates utilizing a wet chemical etching process to perform the pattern transfer. The patterned resist 16 is typically removed after the pattern transfer process by a stripping process that is well known to those skilled in the art. Note that this step shown in FIG. 1B can be omitted if no hardmask 14 is present in the initial structure 10.

Figure 1C:
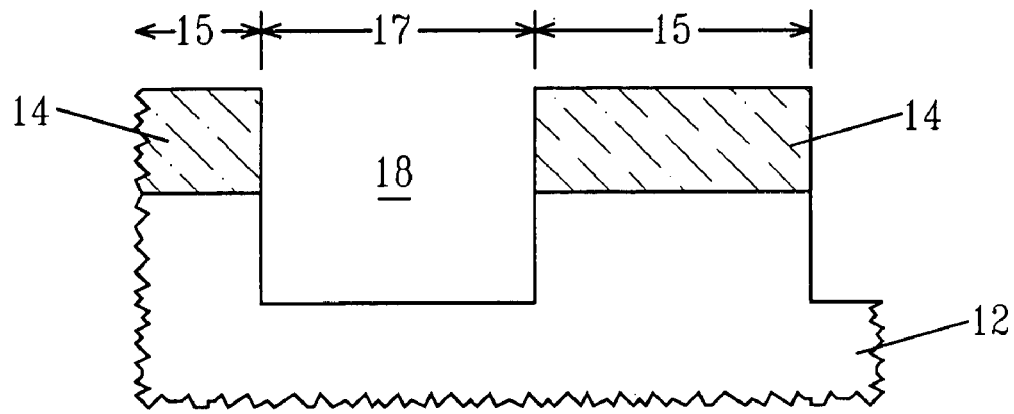

The pattern, i.e., the at least one opening 18, is then transferred into the Si-containing substrate 12 or, if present, the polySi layer, by utilizing one of the above mentioned etching processes. Specifically, this step of the present invention, which is illustrated in FIG. 1C, recesses the Si-containing substrate 12 or, if present, the polySi layer, to a depth, as measured from the top surface of either the Si-containing substrate 12 or, if present, the polySi layer, from about 1000 to about 3000 Å. The aforementioned steps provide a non-recessed region 15 and a recessed region 17 in the structure. See FIG. 1C If present, the optional hardmask 14 can be removed from the surface of the structure at this point of the present invention, or it can remain on the structure during the SIMOX step. The optional hardmask 14 is removed by utilizing a planarization process such as chemical mechanical polishing (CMP) or grinding.

A SIMOX process is now performed on the structure shown in FIG. 1C (with or without the hardmask 14) which includes ion implantation and annealing. The ion implant step includes the implantation of oxygen ions, nitrogen ions or combinations thereof. Preferably, oxygen ions are employed. The ion implantation step is performed using an ion dose of about 1E17 atoms/$cm^2$ or greater, with an ion dose from about 1E17 to about 5E17 atoms/$cm^2$ being more preferred. The implant step may be performed in a continuous mode, or in a pulse mode.

The implant is also performed using a conventional implanter in which a beam current density from about 0.05 to about 50 milliAmps/$cm^2$ is typically employed. More typically, a beam current density from about 5 to about 50 milliAmps/$cm^2$ is employed in the present invention. The implant is performed at an energy from about 40 keV or greater, with an energy from about 100 to about 200 keV being more typical.

The implant step is typically performed at a temperature from about 200° to about 600° C., with an implant temperature from about 200° to about 400° C. being more typical.

In addition to the single, i.e., base implant step mentioned above, an optional second implant step may be performed to enhance the uniformity of the buried insulating region to be subsequently formed. The optional second implant step is performed at a second dose of about 1E16 atoms/$cm^2$ or greater. More preferably, the optional second implant step is performed using a ion dose from about 1E16 to about 5E17 atoms/cm$^2$. The optional second implant may be performed using a continuous mode, or a pulse mode may be employed.

The optional second ion implant step of the present invention is performed using a beam current density from about 0.05 to about 5 milliAmps/cm$^2$. The optional second implant step of the present invention is typically performed at a temperature from about 4K to about 200° C. More typically, the temperature in which the optional implant is performed is from about nominal room temperature to about 100° C. The optional implant step is performed at an energy from about 40 to about 1000 keV, with an energy from about 100 to about 200 keV being more typical.

After performing the implant step, the structure is annealed using an oxidation process at a temperature at which the implant precipitates as oxides, nitrides or oxynitrides, and the precipitated material combines to form a thin, uniform buried insulating layer 20. In a preferred embodiment, the buried insulating layer 20 is an oxide; therefore a buried oxide forms.

In accordance with the present invention, the buried insulating region 20 within the non-recessed region 15 is referred to a first buried insulating region, while the buried insulating region 20 in the recessed region 17 is referred to as the second buried insulating region. As shown, the first buried insulating region 20 in the non-recessed region 15 is located above the second buried insulating region 20 in the recessed region 17. The distance separating the two different level buried insulating regions is typically from about 30 to about 120 nm.

Figure 1D:
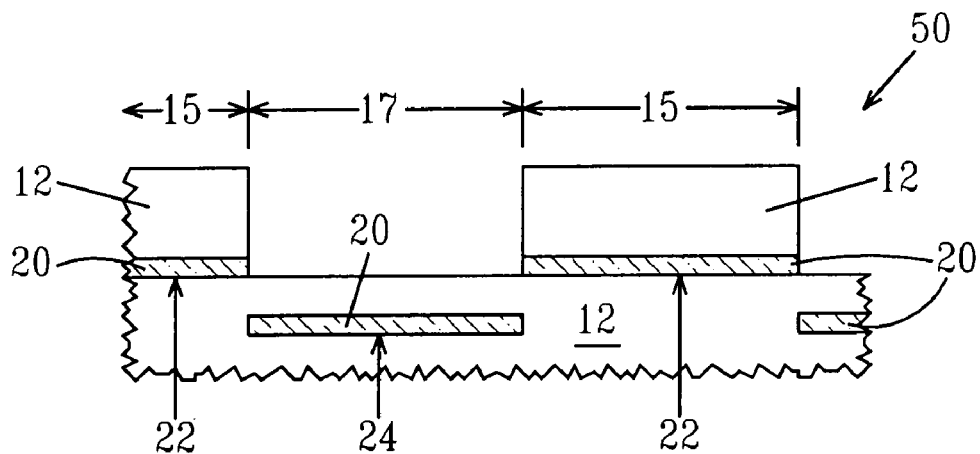

Note that an oxide layer (not specifically shown or labeled in the drawings) is formed atop the Si-containing substrate 12, or the polySi layer, during the heating step. This surface oxide layer is typically, but not always, removed from the structure after the heating step using a conventional wet etch process wherein a chemical etchant such as HF that has a high selectivity for removing oxide as compared to silicon is employed. FIG. 1D shows the structure after formation of the buried insulating region 20 and removal of the surface oxide layer.

The thickness of the buried insulating region 20 can be controlled to desired values by adjusting the thermal oxidation conditions. The surface oxide layer formed after the heating step of the present invention has a variable thickness which may range from about 10 to about 1000 nm, with a thickness from about 20 to about 500 nm being more typical. The buried insulating layer 20 typically has a thickness from about 100 to about 150 nm, with a thickness from about 130 to about 140 nm being more typically.

Specifically, the annealing step of the present invention is a thermal oxidation process that is performed at a temperature from about 650° to about 1350° C., with a temperature from about 1200° to about 1325° C. being more highly preferred. Moreover, the annealing of the present invention is carried out in an oxidizing ambient which includes at least one oxygen-containing gas such as O$_2$, NO, N$_2$O, ozone, air and other like oxygen-containing gases. The oxygen-containing gas may be admixed with each other (such as an admixture of O$_2$ and NO), or the gas may be diluted with an inert gas such as He, Ar, N$_2$, Xe, Kr, or Ne. When a diluted ambient is employed, the diluted ambient contains from about 0.5 to about 99.9% of oxygen-containing gas, the remainder, up to 100%, being inert gas.

The annealing step may be carried out for a variable period of time that typically ranges from about 10 to about 1800 minutes (at 1200° to about 1325° C.), with a time period from about 60 to about 600 minutes being more typical. The annealing step may be carried out at a single targeted temperature, or various ramp and soak cycles using various ramp rates and soak times can be employed.

At this point of the present invention, the structure shown in FIG. 1D may be used as is. Specifically, the structure shown in FIG. 1D is a dual depth SOI structure 50 that includes a first SOI region 22 having a first buried insulating region 20 in the non-recessed region 15 and a second SOI region 24 having a second buried insulating region 20 in the recessed region 17.

Figure 1E:
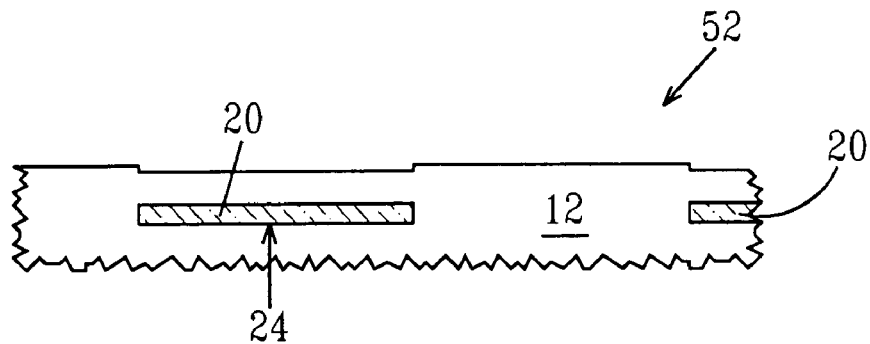

In some embodiments of the present invention, the structure 50 shown in FIG. 1D is then subjected to a wet etching step in which the first buried insulating region 20 in the first SOI region 22 that was not recessed as well as the overlaying material are removed from the structure so as to provide the structure 52 shown in FIG. 1E. Structure 52 thus includes the second SOI region 24 and a non-SOI region 26. Specifically, the structure 52 shown in FIG. 1E is formed by subjecting the exposed sidewalls of the first buried insulating region 20 within the non-recessed region 15, to a wet etch process that selectively removes insulating material, e.g., oxide, to undercut and lift off the regions of the Si-containing substrate 12, or optionally the polysi layer, where the first buried insulating regions 20 are in contact with the recessed area 17. An example of an etching process that can be used in this step of the present invention comprises BHF (10:1). The resultant structure 52 is a substantially planar structure. A planarization process such as CMP or grinding can be performed after the lift-off procedure to improve the planarity of the structure.

Figure 2:
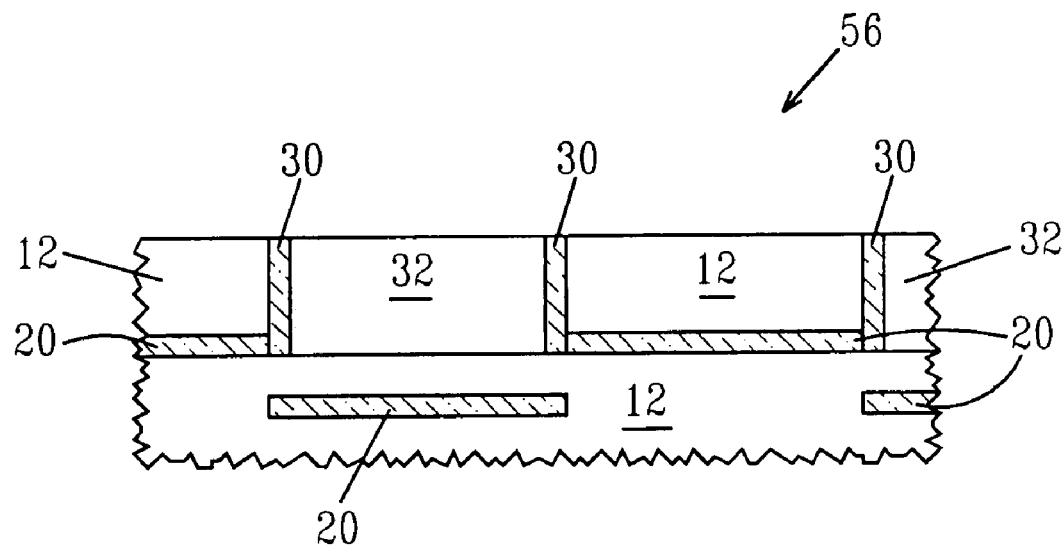
FIG. 2 is a pictorial representation (through a cross sectional view) illustrating further processing steps that can be performed on the structure shown in FIG. ID.

Further processing steps can also be performed on the dual depth SOI structure 50 shown in FIG. 1D so as to provide structure 56 shown in FIG. 2. Specifically, the sidewalls of the recessed region 17 in the second SOI region 24 can be lined with a dielectric material so as to provide a spacer 30 on the sidewalls of the recessed region 17 in the at least one opening 18. The spacer 30 is formed by deposition and etching. The spacer 30 is comprised of an insulating material including, for example, an oxide, nitride, oxynitride or combinations, including multilayers thereof. The spacer 30 typically has a thickness from about 20 to about 100 nm, with a thickness from about 40 to about 80 nm being more typical.

The least one opening 18 in the recessed region 17 is then filled with a semiconductor material 32 such as one of the above mentioned Si-containing semiconductor materials or a non Si-containing material such as GaAs, InAs, InP or Ge. The semiconductor material 32 is formed by a conventional deposition process including, epitaxial growth. In one preferred embodiment, the semiconductor material 32 is comprised of Si which is formed by epitaxial growth performed at 750° C., for example, in a gas such as silane or dichlorosilane. The structure 56 shown in FIG. 2 is substantial planar, i.e., the semiconductor material 32 is substantially coplanar to the upper and non-recessed surface of the Si-containing substrate 12 or the polySi layer.

Conventional CMOS processing steps can be performed on the structure shown in either FIG. 1E, FIG. 1D or FIG. 2. The devices formed atop the substrates shown in FIGS. 1E and 2 would be formed on a SOI region, while the device formed on the substrate shown in FIG. 1D can be located atop SOI regions or non-SOI, i.e., bulk, regions. In other embodiments, the Si-containing substrate 12 comprises a SiGe alloy layer 12B located atop a bulk Si layer 12A. The above processing steps up to, and including, the SIMOX step are performed providing the structure 58 shown in FIG. 3. In this structure, some of the buried insulating regions 20 are located at the interface between the bulk Si layer 12A and SiGe alloy layer 1B (see first SOI region 22), while other buried insulating regions 20 are buried with bulk Si layer 12A (see second SOI region 24). It is noted that in FIG. 3, 12B could also be a polysilicon layer instead of a SiGe layer.

Figure 3:
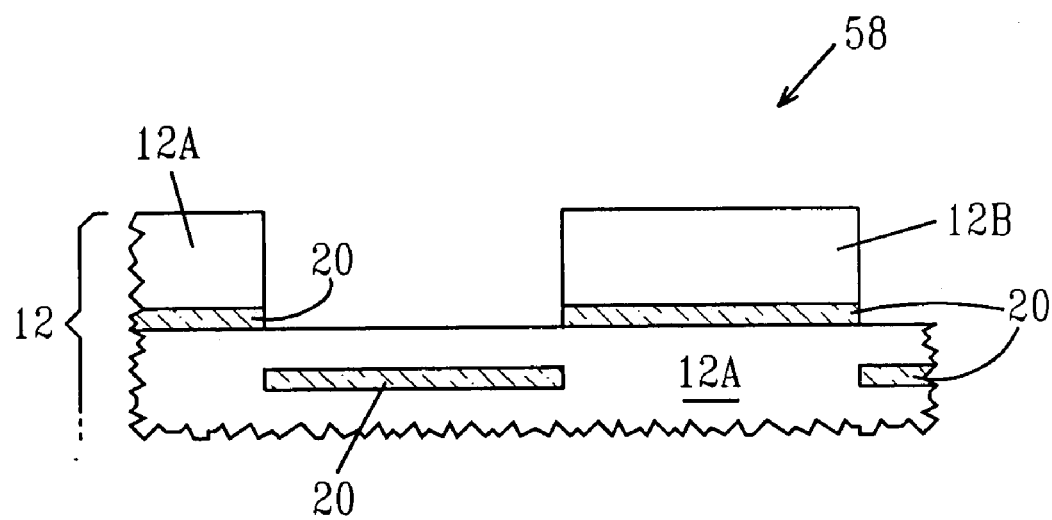
FIG. 3 is a pictorial representation (through a cross sectional view) illustrating another substrate that can be formed in the present invention.

The structure 58 shown in FIG. 3 may be processed to provide a structure that is similar to the one shown in FIG. 2.

In the various embodiments described and illustrated above, the Si-containing substrate 12 and the semiconductor material 32 have the same crystallographic orientations, which may be (110), (111) or (100).

It should be noted that variations of the above processing steps can be made to the mask or etching depths to form slightly modified structures from those described, but those skilled in the art will recognize these as still being within the scope of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim is:

1. A method of forming a patterned silicon-on-insulator (SOI) substrate comprising:
    forming a silicon mask having at least one opening on a surface of Si-containing material;
    recessing the Si-containing material through the at least one opening using an etching process to provide a structure having a recess region and a non-recessed region; and
    forming a first buried insulating region in said non-recessed region and a second buried insulating region in said recessed region, wherein said first buried insulating region in said non-recessed region is located above said second buried isolation region in said recessed region.

2. The method of claim 1 wherein said silicon mask comprises a resist or a resist/hardmask bilayer.

3. The method of claim 2 wherein said hardmask comprises an oxide, nitride, oxynitride, polysilicon or combinations thereof.

4. The method of claim 1 wherein said Si-containing material comprises a Si-containing substrate.

5. The method of claim 1 wherein said Si-containing material comprises a Si-containing substrate having a polysilicon or a SiGe layer located thereon.

6. The method of claim 1 wherein said forming said silicon mask having the at least one opening comprises lithography and optionally etching.

7. The method of claim 1 wherein said etching process of said recessing the Si-containing material through the at least one opening comprises a dry etching step.

8. The method of claim 1 wherein said forming said first and second buried insulating regions comprises a step of ion implantation and a step of annealing.

9. The method of claim 8 wherein said step of ion implantation comprises implanting at least one of oxygen ions or nitrogen ions.

10. The method of claim 8 wherein said step of ion implantation is performed using an ion dose of about 1E17 atoms/cm$^2$ or greater.

11. The method of claim 8 wherein said step of ion implantation is performed using an implant energy from about 40 keV or greater and at a temperature from about 200° to about 600° C.

12. The method of claim 8 wherein said step of ion implantation is performed using a base ion implant step and a second ion implantation step that is performed at a temperature from about 4K to about 200° C.

13. The method of claim 8 wherein said annealing is performed at a temperature from about 650° to about 1325° C. in an oxidizing ambient.

14. The method of claim 1 further comprises performing a lift-off process in which the first buried insulating region and Si-containing material that lays thereabove are removed.

15. The method of claim 14 wherein said lift-off process comprises a wet chemical etchant.

16. The method of claim 14 further comprising a planarization processing step performed after said lift-off process.

17. The method of claim 1 further comprising lining said at least one opening located above said second buried insulating region with an insulator and filling remaining portions of the at least one opening with a semiconductor material.

18. The method of claim 17 further comprising a planarization process.

19. The method of claim 1 further comprising forming a complementary metal oxide semiconductor device over both said first buried insulating region and said second buried insulating region.

20. A method of forming a patterned silicon-on-insulator (SOI) substrate comprising:
    forming a silicon mask having at least one opening on a surface of Si-containing material;
    recessing the Si-containing material through the at least one opening using an etching process to provide a structure having a recess region and a non-recessed region;
    forming a first buried insulating region in said non-recessed region and a second buried insulating region in said recessed region, wherein said first buried insulating region in said non-recessed region is located above said second buried isolation region in said recessed region; and
    performing a lift-off etching step that is capable of removing said buried first insulating region within said non-recessed region as well as the Si-containing material that overlays the first buried insulating region.

* * * * *